(12) United States Patent
Chai et al.

(10) Patent No.: US 12,312,127 B2
(45) Date of Patent: May 27, 2025

(54) PROCESS CARRIER

(71) Applicant: ENTEGRIS, INC., Billerica, MA (US)

(72) Inventors: Lim Joo Chai, Kulim (MY); Michael C. Zabka, New Prague, MN (US)

(73) Assignee: ENTEGRIS, INC., Billerica, MA (US)

( * ) Notice: Subject to any disclaimer, the term of this patent is extended or adjusted under 35 U.S.C. 154(b) by 0 days.

(21) Appl. No.: 17/948,923

(22) Filed: Sep. 20, 2022

(65) Prior Publication Data

US 2023/0088106 A1 Mar. 23, 2023

Related U.S. Application Data

(60) Provisional application No. 63/247,038, filed on Sep. 22, 2021.

(51) Int. Cl.
*B65D 85/48* (2006.01)
*B65D 1/36* (2006.01)
*B65D 25/10* (2006.01)

(52) U.S. Cl.
CPC ............ *B65D 25/107* (2013.01); *B65D 1/36* (2013.01)

(58) Field of Classification Search
CPC ...... B65D 25/107; B65D 85/30; B65D 85/48; H01L 21/67383; H01L 21/67373; H01L 21/67379; H01L 21/67369
USPC ............ 206/454, 710, 711, 832; 211/41.18
See application file for complete search history.

(56) References Cited

U.S. PATENT DOCUMENTS

| | | | | |
|---|---|---|---|---|
| 4,160,504 A | * | 7/1979 | Kudlich | B65D 25/107 206/711 |
| 8,453,841 B1 | | 6/2013 | James et al. | |
| 2003/0010672 A1 | * | 1/2003 | Simpson | H01L 21/67326 211/41.18 |
| 2003/0010673 A1 | * | 1/2003 | Duban-Hu | H01L 21/67383 206/711 |
| 2003/0025245 A1 | * | 2/2003 | Bhatt | H01L 21/6732 264/254 |
| 2003/0205501 A1 | * | 11/2003 | Hachtmann | G11B 33/0444 |
| 2004/0074808 A1 | | 4/2004 | Bhatt | |
| 2005/0109665 A1 | * | 5/2005 | Duban-Hu | G11B 33/0444 206/832 |

(Continued)

FOREIGN PATENT DOCUMENTS

| | | | |
|---|---|---|---|
| KR | 19990035843 U | | 9/1999 |
| KR | 20100010965 A | * | 2/2010 |
| TW | 200832600 A | | 8/2008 |

*Primary Examiner* — Luan K Bui (57) ABSTRACT

A process container includes flanges defining a plurality of slots. At least one of the flanges includes a tightener configured to contact a disc or wafer when the disc or wafer is inserted into one of the plurality of slots defined by said at least one of the plurality of flanges. The tightener projects outwards from said at least one of the plurality of flanges into said one of the plurality of slots. The tightener includes a tapered portion where a cross-sectional thickness of the at least one tightener increases along an insertion direction of the disc or wafer into said one of the plurality of slots. The tightener can include one continuous slope or curve. The tightener can include a chamfer. The tightener has a reduced contact area and a smooth transition as it extends from the flange, reducing rubbing and the corresponding particle shedding when discs or wafers are inserted into, removed from, or moving while stored within the process container.

13 Claims, 5 Drawing Sheets

(56) References Cited

U.S. PATENT DOCUMENTS

2006/0021896 A1* 2/2006 Cleathero .......... G11B 33/0472
211/41.18
2006/0283774 A1* 12/2006 Hasegawa ......... H01L 21/67369
206/832
2015/0068949 A1 3/2015 Raschke et al.

* cited by examiner

PROCESS CARRIER

FIELD

This disclosure is directed to process carriers for discs or wafers, particularly process carrier including tighteners to secure the discs or wafers.

BACKGROUND

Discs or wafers can be stored in process carriers for transportation, storage, and processing of discs or wafers, for example during the manufacture of discs or wafers. The discs or wafers can be stored in slots. The slots can include tighteners to further secure the discs or wafers within those slots. These tighteners tend to project significantly from the slots, and provide significant surface areas to secure the position of the discs or wafers when they are contacting the tighteners. Rubbing of discs or wafers against the tighteners during insertion, retention, and removal of the discs or wafers from the process carrier can result in rubbing that causes the process carrier to shed particulate matter.

SUMMARY

This disclosure is directed to process carriers for discs or wafers, particularly process carrier including tighteners to secure the discs or wafers.

By providing a smooth transition to the tightener retaining the disc or wafer and lowering the point at which the tightener reaches its maximum thickness, process containers according to embodiments can provide sufficient retention while using smaller and more gradual contact areas. This in turn reduces the particle shedding associated with the insertion, storage, or removal of discs or wafers from the process container.

In an embodiment, a process carrier includes a plurality of flanges extending into an interior space of the process carrier, the plurality of flanges defining a plurality of slots. At least one of the plurality of flanges includes a tightener configured to contact a disc or wafer when the disc or wafer is inserted into one of the plurality of slots defined by said at least one of the plurality of flanges. The tightener projects outwards from said at least one of the plurality of flanges into said one of the plurality of slots. The tightener includes a tapered portion where a cross-sectional thickness of the at least one tightener increases along an insertion direction of the disc or wafer into said one of the plurality of slots.

In an embodiment, the tightener is formed integrally with said at least one of the plurality of flanges.

In an embodiment, at least one of the slots is defined by two of the plurality of flanges, each of the two of the plurality of flanges including said tightener.

In an embodiment, each of the plurality of flanges includes at least one of said tighteners.

In an embodiment, the tapered portion extends at least half of a length of the tightener in the insertion direction of the wafer.

In an embodiment, the tapered portion is concave on a side facing into said one of the plurality of slots.

In an embodiment, the tightener further includes a retention portion having a maximum cross-sectional thickness of the tightener.

In an embodiment, the retention portion extends at most one third of a length of the tightener in the insertion direction of the wafer.

In an embodiment, the process carrier includes a curved surface where the tapered portion meets the retention portion.

In an embodiment, the tightener includes a chamfer on a side of the tightener towards an end of said one of the plurality of flanges in the interior space of the process carrier.

In an embodiment, the process carrier includes a polyether ether ketone (PEEK) material. In an embodiment, the process carrier is entirely the PEEK material. In an embodiment, the PEEK materials is a composite including milled carbon fibers.

DETAILED DESCRIPTION

This disclosure is directed to process carriers for discs or discs or wafers, particularly process carrier including tighteners to secure the discs or wafers.

Figure 1:
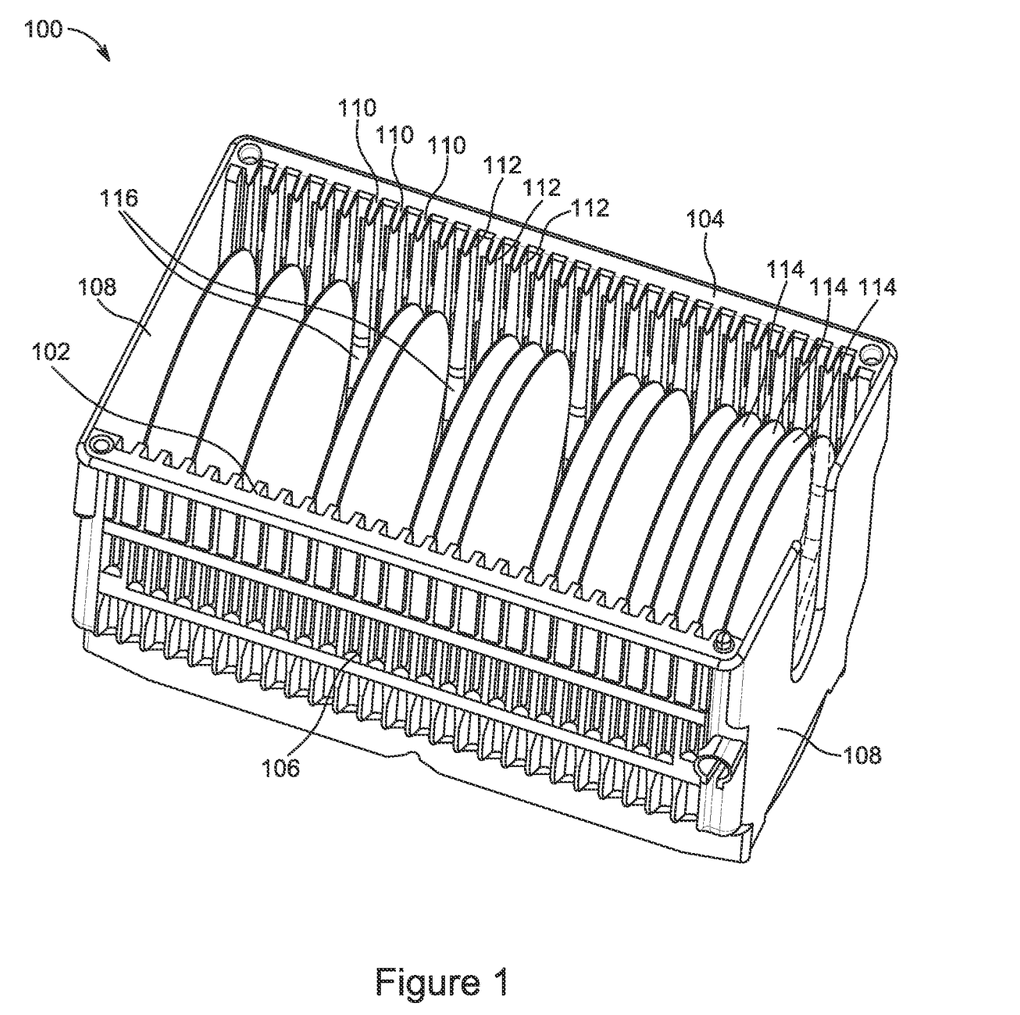
FIG. 1 shows a process carrier according to an embodiment.

FIG. 1 shows a process carrier according to an embodiment. Process carrier 100 includes a carrier body 102 defining an internal space. Carrier body 102 includes a first side wall 104, a second side wall 106, and end walls 108. A plurality of flanges 110 extend from the first side wall 104 and the second side wall 106, the flanges 110 protruding into the internal space. The flanges 110 define slots 112 each capable of receiving a disc or wafer 114. At least some of flanges 110 include one or more tighteners 116.

Process carrier 100 is a carrier for one or more of the discs or wafers 114. Process carrier 100 can be used in the transportation, storage, and/or processing of discs or wafers 114. Discs or wafers 114 can be any suitable wafer, such as semiconductors, hard disc drive components, or the like. In an embodiment, discs or wafers 114 can be hard disc drive storage discs. Process carrier 100 can be configured to hold each of the discs or wafers 114 such that the plane of the discs or wafers 114 is oriented in a substantially vertical direction, understanding that there may be some deviation from completely vertical due to the sizing of the slots 112 relative to the discs or wagers 114, manufacturing tolerances, and the like.

Carrier body 102 defines the process carrier 100. Process carrier 100 can be any suitable material for contacting the discs or wafers and undergoing any suitable processing that the discs or wafers receive. In embodiments, the carrier body 102 can include a polymer material. In an embodiment, carrier body 102 can include a poly-ether-ether-ketone (PEEK) material. In an embodiment, carrier body 102 is made entirely of PEEK material. In an embodiment, the carrier body 102 can be a composite including fiber material such as, as a non-limiting example milled carbon fibers. Carrier body 102 can be shaped to define an internal space capable of accommodating a predetermined number of the discs or wafers 114. The internal space can be defined at least in part by first side wall 104, second side wall 106, and end walls 108. Carrier body 102 can further be configured to be placed into a storage container and/or one or more processing tools used in the processing of discs or wafers 114.

Flanges 110 extend inwards from the side walls 104, 106 of carrier body 102. The flanges 110 partially extend in the horizontal direction H, into the internal space within carrier body 102. The flanges 110 each also extend in a vertical direction V of the carrier body 102, along the respective side wall 104, 106 of the carrier body 102 that they extend from. The flanges 110 are distributed along the longitudinal direction L of the carrier body 102 such that the flanges 110 are in corresponding positions on the opposing first and second side walls 104, 106. Slots 112 are defined by the flanges 110. Each of the slots 112 is sized such that it can accommodate one of the discs or wafers 114. The slots 112 can each be defined by a pair of adjacent flanges 110 on each of the opposing side walls 104, 106 of carrier body 102.

Discs or wafers 114 can be any suitable disc or wafer that can be stored in process carrier 100. Discs or wafers 114 can be, as non-limiting examples, substrates, semiconductor discs or wafers, discs for hard disc drives, or the like. The discs or wafers 114 can be placed into process carrier 100 at any suitable stage of storage, processing, or transportation of such discs or wafers. In an embodiment, the discs or wafers 114 are discs for hard disc drives. The size and shape of the internal space defined by carrier body 102 and the size of the slots 112 as defined by the distribution and size of the flanges 110 and tighteners 116 can be such that the discs or wafers can be inserted into and retained within the slots 112.

Tighteners 116 are located on flanges 110. Tighteners 116 project outwards from flanges 110 into the slots 112 such that the tighteners 116 provide the contact retaining discs or wafers 114 in the respective slots 112. Tighteners 116 can be used to ensure that discs or wafers 114 are retained closer to a vertical orientation when the discs or wafers 114 are retained in slots 112.

The tighteners 116 can be configured to have a smooth transition from the surface of flanges 110 to the surfaces of tightener 116 that in turn contact discs or wafers 114. In an embodiment, an angle between a surface of the flange 100 and a surface of tightener 116 at an end of tightener 116 is less than 30 degrees. In an embodiment, the angle between the surface of flange 100 and the surface of tightener 116 at an end of tightener 116 is less than 15 degrees. In an embodiment, the angle between the surface of the flange 100 and the surface of tightener 116 at an end of tightener 116 is between two degrees and five degrees. In an embodiment, a surface of the tightener 116 and a surface of flange 110 can form a continuous curved or sloped surface as tightener 116 extends from flange 110. In an embodiment, the tightener can have a straight slope as it extends outwards from the corresponding flange 110. In an embodiment, the tightener can include a convex curve as it extends outwards from the corresponding flange 110. In an embodiment, the tightener can include a concave curve as it extends outwards from the corresponding flange 110.

The tighteners 116 can be configured such that a portion of the tightener 116 contacting a disc or wafer 114 to retain the disc or wafer is located proximate to a bottom of the carrier body 102. In an embodiment, a tightener 116 can reach a maximum thickness at a point greater than half of the distance from the beginning of tightener 116 emerging from the flange 110 to where flange 110 and tightener 116 meet the carrier body 102. In an embodiment, the tightener 116 can reach a maximum thickness at a point greater than three-fourths of the distance from the beginning of tightener 116 emerging from the flange 110 to where flange 110 and tightener 116 meet the carrier body 102. Tightener 116 can further include a beveled edge where the tightener 116 and flange 110 extend into the interior space of carrier body 102. In an embodiment, tightener 116 is formed integrally with flange 110. In an embodiment, tightener 116 can be overmolded onto or joined to flange 110.

Figure 2:
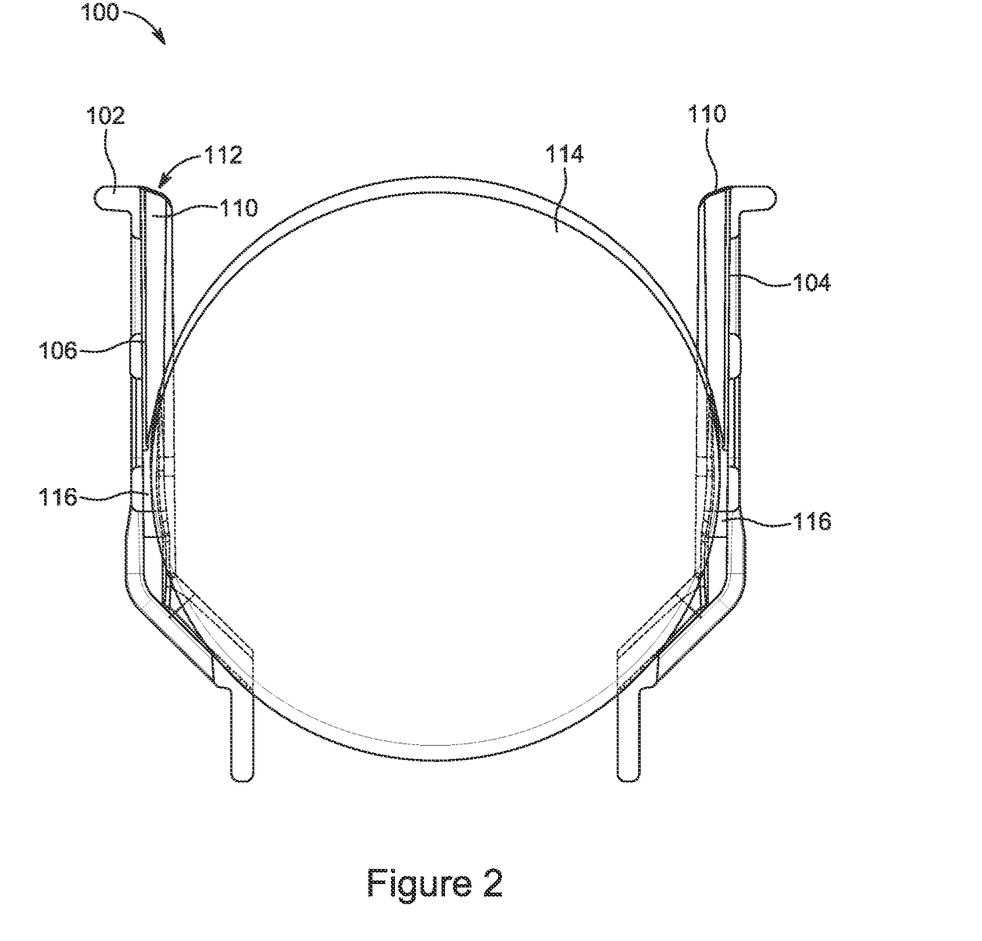
FIG. 2 shows a sectional view of the process carrier of FIG. 1 and containing discs.

FIG. 2 shows a sectional view of a process carrier of FIG. 1 containing discs or wafers 114. In this view, a section is taken in the horizontal direction of the carrier body 102 of the process carrier 100. The flanges 110 and tighteners 116 can be seen in the slot 112 closest to the viewer, with the slot 112 being formed between flange 110/tightener 116 and the section line where the section in the view of FIG. 2 is taken. A disc or wafer 114 is inserted into the slot 112. When the disc or wafer 114 is inserted fully into the slot 112, the disc or wafer 114 can contact tighteners 116 at a contact portion 112. Contact portion 112 can mechanically support the disc or wafer 114 to maintain a vertical orientation of the disc or wafer 114 within process container 100. Contact portion 112 can retain the disc or wafer against another flange such as flange 110 forming an opposite side of the slot 112, or another tightener provided on that other flange.

Figure 3:
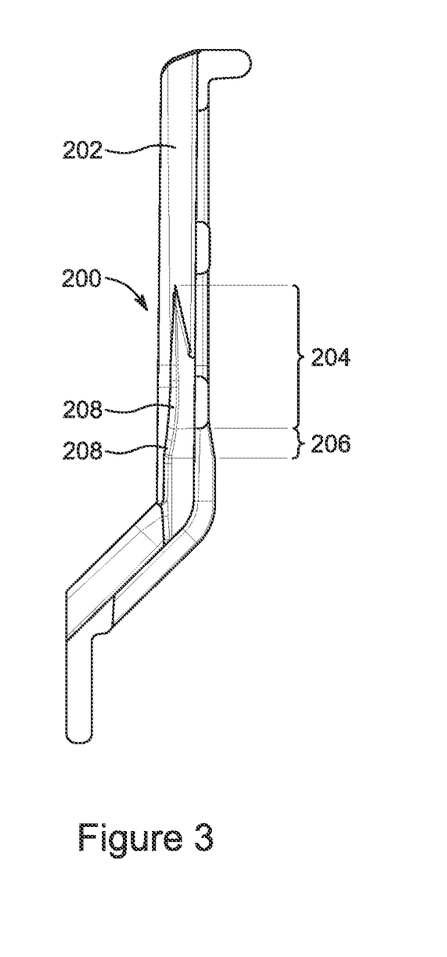
FIG. 3 shows a front view of a tightener in a process carrier according to an embodiment.

FIG. 3 shows a front view of a tightener in a process carrier according to an embodiment. Tightener 200 is disposed on a flange 202. Tightener 200 includes a transition region 204 and a contact region 206. Tightener 200 further includes a beveled edge 208.

Flange 202 is a flange extending into an internal space within a process carrier such as process carrier 100 described above and shown in FIGS. 1 and 2. Flange 202 is configured to at least partially define a slot within the process carrier 100. The slot can be used to hold a disc or wafer such as disc or wafer 114 described above and shown in FIGS. 1 and 2. Tightener 200 extends outwards from flange 202 into one of the slots defined by flange 202, the thickness of tightener 200 narrowing the slot to contact and retain a wafer. In the front view of FIG. 3, the tightener 200 extends towards the viewer with respect to the surface of flange 202. In an embodiment, tightener 200 is formed integrally with flange 202. In an embodiment, tightener 200 can be overmolded onto or joined to flange 202.

Tightener 200 extends from flange 202 at a portion of flange 202 towards a bottom of the process carrier. Tightener 200 includes transition region 204 at an end towards the upper part of the process carrier. The transition region 204 can be a tapered portion of the tightener 200. The thickness of tightener 200 increases over the length of the transition region 204 in the vertical direction, i.e. as one moves from an upper portion of the process container to a bottom of the flange 202 where it meets a wall of the process container. The transition region 204 provides a smooth transition from the surface of flange 202 to the surface of tightener 200 as tightener 200 projects from flange 202. The transition region 204 can include a straight slope or a curve. A thickness of the tightener 200 can increase when moving from an end of transition region 204 meeting flange 202 to where the transition region 204 meets the contact region 206. The transition region 204 can guide a disc or wafer as it is inserted into the slot including tightener 200.

Contact region 206 is a portion of tightener 200 including at least the portion of tightener 200 having the greatest thickness and any portion of tightener 200 closer to the bottom of the process container than said portion having the greatest thickness. In an embodiment, at least a portion of the surface of contact region 206 is parallel with a surface of flange 202. The extent to which contact region 206 projects from flange 202 can be based on a length of tightener 200 and the angle between the surface of flange 202 and the transition region 204. The contact region 206 is configured to contact a disc or wafer to secure the disc or wafer with reduced tilting compared to flanges 202 by themselves. The extent of the reduction in tilting can be selected to be any suitable permissible tilting, for example the extent of tilting permitted in a particular process or when using a particular tool. In an embodiment, contact region 206 extends from transition region 204 to side and/or bottom walls of the process carrier body such as side walls 104, 106 of carrier body 102 described above and shown in FIGS. 1 and 2. The contact region 206 can make up the end of tightener 200 closest to the bottom of the process carrier. In an embodiment, the contact region 206 has a constant thickness. In an embodiment, a surface at the junction between transition region 204 and contact region 206 is a continuous curve. In an embodiment, a surface of transition region 204 meeting a surface of contact region 206 forms a predetermined angle. In an embodiment, where the transition region 204 meets contact region 206 is radiused.

In tightener 200, the contact region 206 can form only a portion of the overall length of tightener 200 along the flange 202. In an embodiment, the contact region 206 has a length that is less than half of an overall length of tightener 200. In an embodiment, the contact region 206 has a length that is less than one quarter of the overall length of the tightener 200. The contact region 206 can be shaped and sized to reduce an area of contact between the tightener 200 and a disc or wafer when the disc or wafer has been fully inserted into a slot defined at least in part by flange 202 and tightener 200. The size of the area of contact between tightener 200 and the disc or wafer on contact region 206 can be selected based on permissible deflection of the disc or wafer from a vertical when the disc or wafer is in the process carrier.

Beveled edge 208 can be provided on one or both of the transition region 204 and the contact region 206. The beveled edge 208 can be provided on a side of the tightener 200 towards the side of the flange 202 that is towards the internal space of the process carrier. A thickness of tightener 200 can decrease across the beveled edge 208 when moving in a horizontal direction towards an interior space of the process carrier. The beveled edge 208 can include a straight edge, a concave curve, or a convex curve. The beveled edge 208 can be configured to receive a part of a curved end of a wafer, such as a circular wafer, and provide a smooth transition that can guide the curved end of the disc or wafer into the slot defined by the flange 202 such that the disc or wafer can be secured by contact region 206 of tightener 200.

Figure 4:
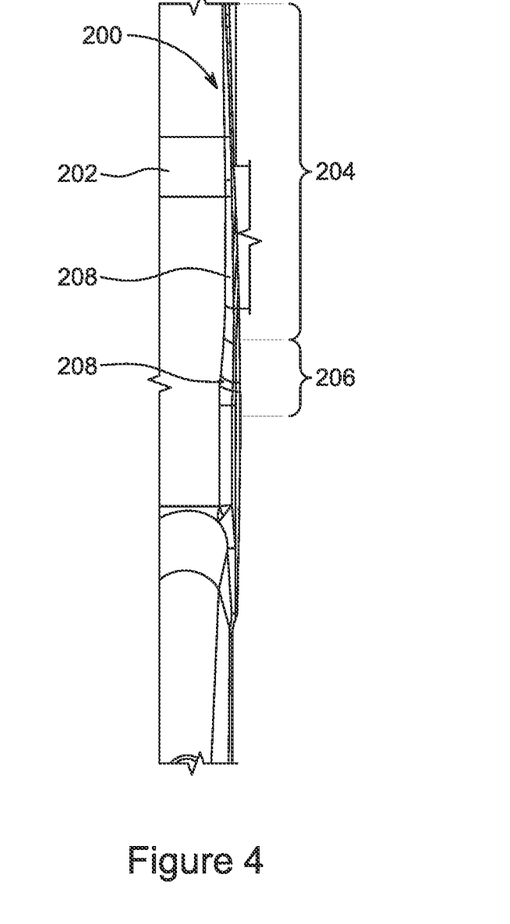
FIG. 4 shows a side view of the tightener of FIG. 3.

FIG. 4 shows a side view of the tightener of FIG. 3. As can be seen in the side view of FIG. 4, tightener 200 extends outwards from flange 202 into a slot defined between flange 202 and another flange (not shown), which can include another tightener (not shown). The tightener 200 effectively adds to a thickness of the flange 200 when moving from an upper part of the slot towards a bottom of the slot. In the side view of FIG. 4, the beveled edges 208 can be seen on each of the transition region 204 and the contact region 206. Further, the increase in thickness of the tightener 200 over the transition region 204 can be seen in the side view of FIG. 4. In an embodiment, as shown in FIG. 4, the flange 202, transition region 204, and contact region 206 can be configured to be a continuous surface that can include curves but does not include corners or edges in transition region 204, contact region 206, or the transitions from flange 202 to transition region 204 or from transition region 204 to contact region 206.

Figure 5:
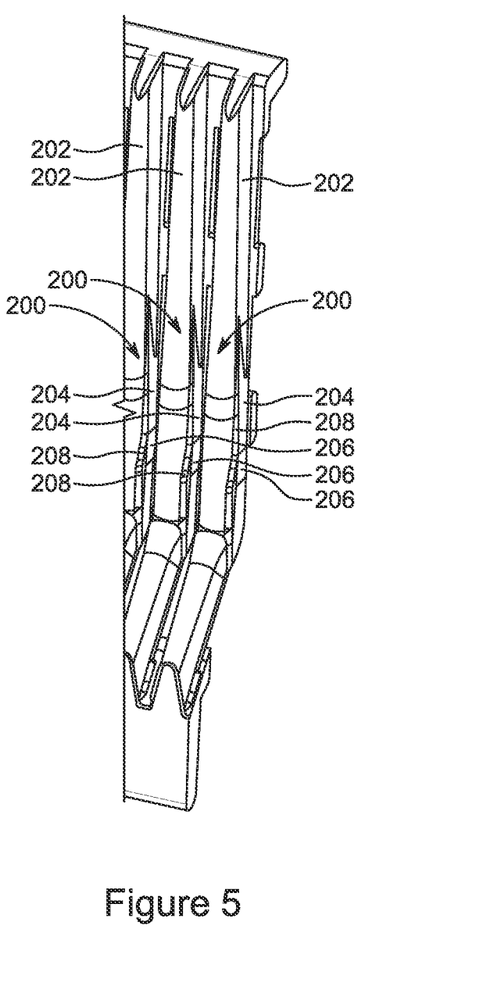
FIG. 5 shows a perspective view of a section of a process carrier including multiple tighteners.

FIG. 5 shows a perspective view of a section of a process carrier including multiple tighteners. Each of flanges 202 in FIG. 5 include at least one tightener 200, with each tightener 200 including a transition region 204, a contact region 206, and a beveled edge 208 as described above and also shown in FIGS. 3 and 4.

Aspects:

Aspect 1. A process carrier, comprising:
a plurality of flanges extending into an interior space of the process carrier, the plurality of flanges defining a plurality of slots;
at least one of the plurality of flanges including a tightener configured to contact a disc or wafer when the disc or wafer is inserted into one of the plurality of slots defined by said at least one of the plurality of flanges;
wherein the tightener projects outwards from said at least one of the plurality of flanges into said one of the plurality of slots,
the tightener including a tapered portion where a cross-sectional thickness of the at least one tightener increases along an insertion direction of the disc or wafer into said one of the plurality of slots.

Aspect 2. The process carrier according to aspect 1, wherein the tightener is formed integrally with said at least one of the plurality of flanges.

Aspect 3. The process carrier according to any of aspects 1-2, wherein at least one of the slots is defined by two of the plurality of flanges, each of the two of the plurality of flanges including said tightener.

Aspect 4. The process carrier according to any of aspects 1-3, wherein each of the plurality of flanges includes at least one of said tighteners.

Aspect 5. The process carrier according to any of aspects 1-4, wherein the tapered portion extends at least half of a length of the tightener in the insertion direction of the wafer.

Aspect 6. The process carrier according to any of aspects 1-5, wherein the tapered portion is concave on a side facing into said one of the plurality of slots.

Aspect 7. The process carrier according to any of aspects 1-6, wherein the tightener further includes a retention portion having a maximum cross-sectional thickness of the tightener.

Aspect 8. The process carrier according to aspect 7, wherein the retention portion extends at most one third of a length of the tightener in the insertion direction of the wafer.

Aspect 9. The process carrier according to any of aspects 7-8, comprising a curved surface where the tapered portion meets the retention portion.

Aspect 10. The process carrier according to any of aspects 1-9, wherein the tightener includes a chamfer on a side of the tightener towards an end of said one of the plurality of flanges in the interior space of the process carrier.

Aspect 11. The process carrier according to any of aspects 1-10, wherein the process carrier includes a polyether ether ketone (PEEK) material.

Aspect 12. The process carrier according to aspect 11, wherein the process carrier is entirely the PEEK material.

Aspect 13. The process carrier according to aspect 11, wherein the PEEK material is a composite including milled carbon fibers.

The examples disclosed in this application are to be considered in all respects as illustrative and not limitative. The scope of the invention is indicated by the appended claims rather than by the foregoing description; and all changes which come within the meaning and range of equivalency of the claims are intended to be embraced therein.

What is claimed is:

1. A process carrier, comprising:
a carrier body defining an interior space;
a plurality of flanges extending into the interior space of the carrier body, the plurality of flanges defining a plurality of slots;
at least one of the plurality of flanges including a tightener configured to contact a disc or wafer when the disc or wafer is inserted into one of the plurality of slots defined by said at least one of the plurality of flanges;
wherein the tightener contacts the disc at a contact region with a length less than half of an overall length of the tightener,
wherein the tightener projects outwards from said at least one of the plurality of flanges into said one of the plurality of slots,
the tightener including a tapered portion where a cross-sectional thickness of the at least one tightener increases along an insertion direction of the disc or wafer into said one of the plurality of slots.

2. The process carrier of claim 1, wherein the tightener is formed integrally with said at least one of the plurality of flanges.

3. The process carrier of claim 1, wherein at least one of the slots is defined by two of the plurality of flanges, each of the two of the plurality of flanges including said tightener.

4. The process carrier of claim 1, wherein each of the plurality of flanges includes at least one of said tighteners.

5. The process carrier of claim 1, wherein the tapered portion extends at least half of a length of the tightener in the insertion direction of the wafer.

6. The process carrier of claim 1, wherein the tapered portion is concave on a side facing into said one of the plurality of slots.

7. The process carrier of claim 1, wherein the tightener further includes a retention portion having a maximum cross-sectional thickness of the tightener.

8. The process carrier of claim 7, wherein the retention portion extends at most one third of a length of the tightener in the insertion direction of the wafer.

9. The process carrier of claim 7, comprising a curved surface where the tapered portion meets the retention portion.

10. The process carrier of claim 1, wherein the tightener includes a chamfer on a side of the tightener towards an end of said one of the plurality of flanges in the interior space of the process carrier.

11. The process carrier of claim 1, wherein the process carrier includes a polyether ether ketone (PEEK) material.

12. The process carrier of claim 11, wherein the process carrier is entirely the PEEK material.

13. The process carrier of claim 11, wherein the PEEK material is a composite including milled carbon fibers.

* * * * *